United States Patent
Kim et al.

(10) Patent No.: US 7,911,131 B2
(45) Date of Patent: Mar. 22, 2011

(54) ORGANIC LIGHT EMITTING DIODE DISPLAY HAVING DIFFERENTLY COLORED LAYERS

(75) Inventors: Eun-Ah Kim, Suwon-si (KR); Hee-Seong Jeong, Suwon-si (KR); Chul-Woo Jeong, Suwon-si (KR); Joo-Hwa Lee, Suwon-si (KR); Hee-Chul Jeon, Suwon-si (KR); Woo-Suk Jung, Suwon-si (KR); Noh-Min Kwak, Suwon-si (KR); Soon-Ryong Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 39 days.

(21) Appl. No.: 12/397,568

(22) Filed: Mar. 4, 2009

(65) Prior Publication Data

US 2010/0026170 A1 Feb. 4, 2010

(30) Foreign Application Priority Data

Aug. 1, 2008 (KR) .................. 10-2008-0075483

(51) Int. Cl.
*H01L 51/00* (2006.01)
(52) U.S. Cl. ..................... 313/504; 257/59
(58) Field of Classification Search ............ 313/504, 313/506, 59; 257/40, 79
See application file for complete search history.

(56) References Cited

U.S. PATENT DOCUMENTS

| 2006/0152151 A1* | 7/2006 | Seo ................. 313/506 |
| 2007/0238218 A1* | 10/2007 | Teng et al. ............ 438/99 |

FOREIGN PATENT DOCUMENTS

JP 2003-017272 1/2003

* cited by examiner

*Primary Examiner* — Karabi Guharay
(74) *Attorney, Agent, or Firm* — Christie, Parker & Hale, LLP

(57) ABSTRACT

An organic light emitting diode display includes a substrate, a thin film transistor, a planarization layer, a pixel electrode, and a pixel defining layer. The thin film transistor is formed on the substrate and includes a gate electrode, a source electrode, and a drain electrode. The planarization layer is formed on the thin film transistor and has a contact hole that exposes a predetermined part of the drain electrode. The pixel electrode is formed on the planarization layer and is connected to a drain electrode of the thin film transistor through the contact hole. The pixel defining layer is formed on the planarization layer and has an opening that exposes the pixel electrode. The pixel defining layer and the planarization layer have different colors.

6 Claims, 2 Drawing Sheets

ORGANIC LIGHT EMITTING DIODE DISPLAY HAVING DIFFERENTLY COLORED LAYERS

CROSS-REFERENCE TO RELATED APPLICATION

This application claims priority to and the benefit of Korean Patent Application No. 10-2008-0075483 filed in the Korean Intellectual Property Office on Aug. 1, 2008, the entire contents of which are incorporated herein by reference.

BACKGROUND OF THE INVENTION

1. Field of the Invention

The present invention relates to an organic light emitting diode (OLED) display. More particularly, the present invention relates to an OLED display having enhanced visibility.

2. Description of the Related Art

A typical OLED display includes OLEDs each of which has a hole-injection electrode, an organic emission layer, and an electron-injection electrode. The organic emission layer emits light using energy generated when excitons are dropped from an exited state to a ground state after the excitons are generated by the combination of electrons and holes. The OLED display forms images using light emitted from the organic emission layer.

The OLED display has a self emissive characteristic and does not need an additional light source unlike the liquid crystal display (LCD). Therefore, the thickness and weight of a display can be reduced. Also, since the OLED display has high definition characteristics such as low power consumption, high luminance, and high reaction speed, the OLED display has been receiving attention as a next generation display device.

Typically, electrodes and metal wires in the OLED display reflect light entering from the outside. The reflection of external light deteriorates the display and contrast of a black color, thereby deteriorating the overall display characteristics of the OLED display.

SUMMARY OF THE INVENTION

In accordance with the present invention an OLED display is provided having improved visibility by suppressing reflection of external light. That is, the OLED display has improved display characteristics.

An exemplary embodiment of the present invention provides an OLED display that includes a substrate, a thin film transistor (TFT), a planarization layer, a pixel electrode, and a pixel defining layer. The TFT is formed on the substrate and includes a gate electrode, a source electrode, and a drain electrode. The planarization layer is formed on the TFT and has a contact hole that exposes a predetermined part of the drain electrode. The pixel electrode is formed on the planarization layer and connected to a drain electrode of the TFT through the contact hole. The pixel defining layer is formed on the planarization layer and has an opening that exposes the pixel electrode. The pixel defining layer and the planarization layer have different colors.

The brightness of a mixed color of the pixel defining layer and the planarization layer may be lower than each color of the pixel defining layer and the planarization layer.

The color of the pixel defining layer and the color of the planarization layer may be in a complementary color relationship.

One of the planarization layer and the pixel defining layer may have a substantially red color, and the other may have a substantially green color.

The one of the planarization layer and the pixel defining layer having a substantially red color may include an acryl type resin.

Alternatively, one of the planarization layer and the pixel defining layer may have a substantially black color.

The OLED display may further include a conductive layer made of a material substantially the same as at least one of the gate electrode, the source electrode, and the drain electrode, and formed at a layer substantially the same as at least one of the gate electrode, the source electrode, and the drain electrode. At least part of the conductive layer is disposed under the pixel defining layer.

Figure 1:
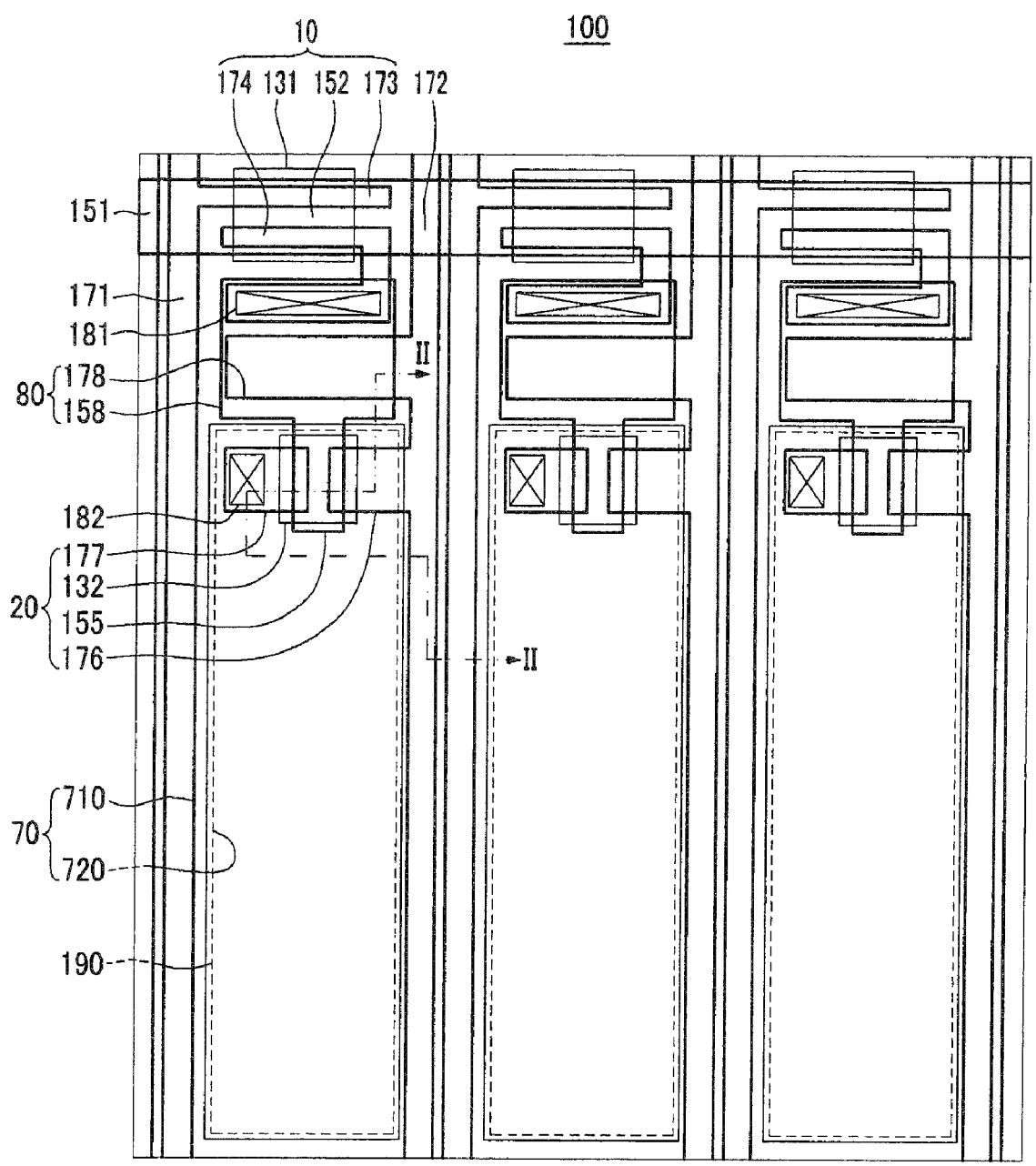
FIG. 1 is a layout view of an OLED display in accordance with an exemplary embodiment of the present invention.

In the drawings, the size and thickness of each element is approximately shown for better understanding and ease of description. The thickness of layers, films, panels, regions, etc., are exaggerated for clarity.

DETAILED DESCRIPTION OF THE EMBODIMENTS

The same or similar constituent elements are designated by the same reference numerals throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Although the accompanying drawings illustrate an active matrix (AM) type of OLED display having a 2Tr-1 Cap structure in which two TFTs and one capacitor are disposed in a pixel, the present invention is not limited thereto. Therefore, the OLED display may have various structures. For example, the OLED display may include more than three TFTs and more than two capacitors at one pixel and further include additional wires.

Here, the pixel is a minimum unit for displaying an image, and the OLED display displays an image through a plurality of pixels.

Figure 2:
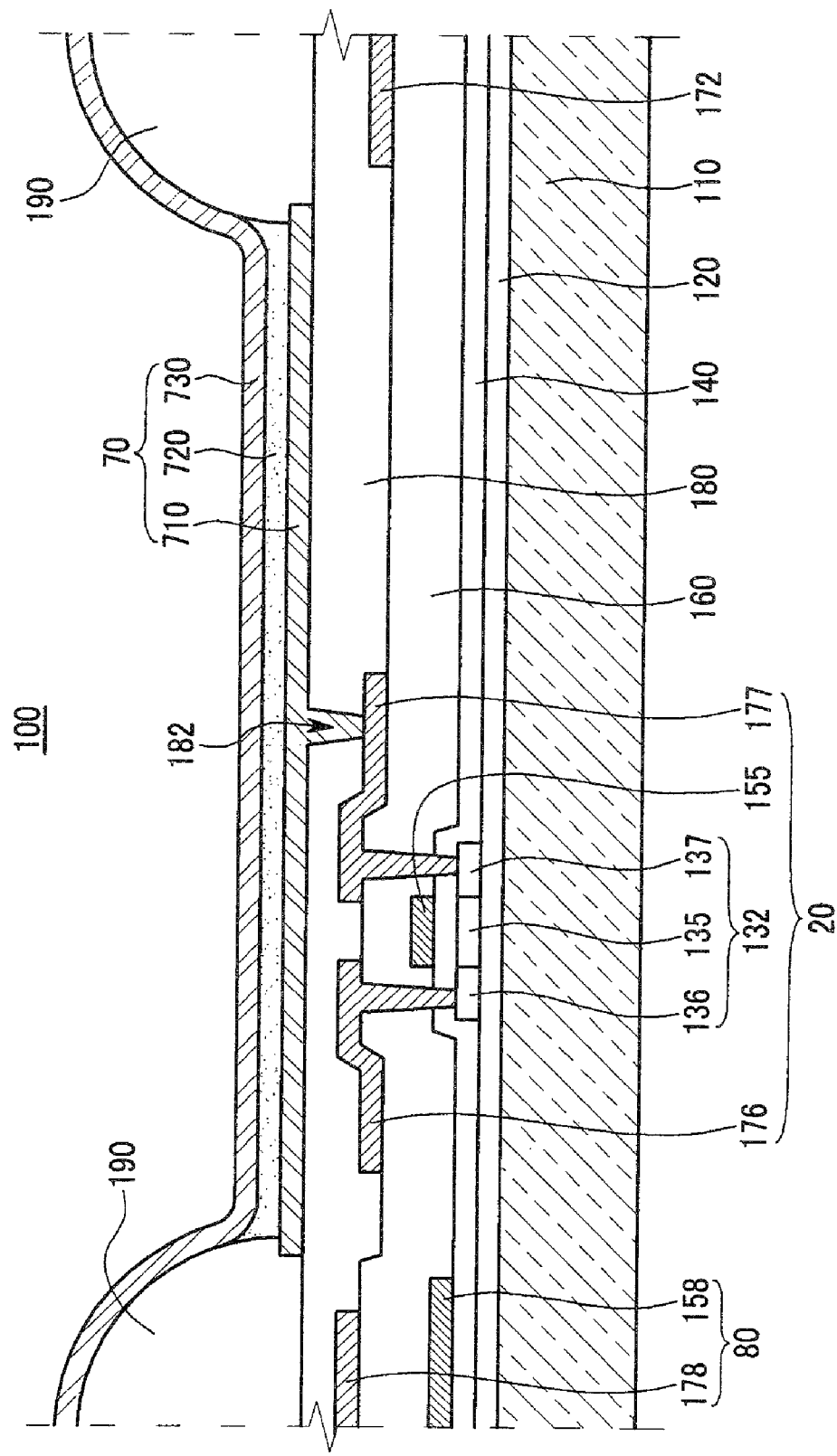
FIG. 2 is a cross-sectional view of FIG. 1 taken along the line II-II.

Referring now to FIG. 1 and FIG. 2, an OLED display 100 includes a switching TFT 10, a driving TFT 20, a capacitor 80, and an OLED 70 in one pixel. The OLED display 100 further includes a gate line 151 disposed along one direction, a data line 171 crossing and insulated from the gate-line 151, and a common power line 172. Here, one pixel is defined by the gate line 151, the data line 171, and the common power line 172 as boundaries.

The organic light emitting element 70 includes a pixel electrode 710, an organic emission layer 720 on the pixel electrode 710, and a common electrode 730 on the organic emission layer 720. Here, the pixel electrode 710 is a hole injection electrode which is an anode (+), and the common electrode 730 is an electron injection electrode which is a cathode (−). However, the present invention is not limited thereto. The pixel electrode 710 may be a cathode and the common electrode 730 may be an anode according to a driving method of the OLED display 100. Holes and electrons are injected into the organic emission layer 720 from the pixel electrode 710 and the common electrode 730, respectively. Light is emitted when excitons generated by the combination of the injected holes and electrons are dropped from an exited state to a ground state.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177.

The capacitor 80 includes a first sustain electrode 158, a second sustain electrode 178, and an interlayer insulating layer 160 interposed therebetween.

The switching TFT 10 is used as a switch to select a pixel to emit light. The switching gate electrode 152 is connected to the gate line 151. The switching source electrode 173 is connected to the data line 171. The switching drain electrode 174 is separated from the switching source electrode 173 and is connected to the first sustain electrode 158.

The driving TFT 20 applies a driving power to drive an organic emission layer 720 of an organic light emitting element 70 in the selected pixel for emitting light. The driving gate electrode 155 is connected to the first sustain electrode 158. The driving source electrode 176 and the second sustain electrode 178 are connected to the common power line 172. The driving drain electrode 177 is connected to the pixel electrode 710 of the organic light emitting element 70 through a contact hole 182.

According to the described structure, the switching TFT 10 is driven by a gate voltage applied to the gate line 151 and transfers a data voltage applied to the data line 171 to the driving TFT 20. The capacitor 80 stores a voltage corresponding to a voltage difference between the common voltage applied to the driving TFT 20 from the common power line 172 and the data voltage transferred from the switching TFT 10, and current corresponding to the voltage stored in the capacitor flows to the organic light emitting element 70 through the driving TFT, thereby emitting light.

Also, the OLED display 100 further includes a planarization layer 180 and a pixel defining layer 190. The pixel defining layer 190 includes an opening that exposes the pixel electrode 710, and the organic emission layer 720 is substantially disposed in the opening of the pixel defining layer 190. That is, in a pixel, an area where the pixel defining layer 190 is formed is substantially equivalent to a remaining area left when the organic emission layer 720 is formed. Therefore, the pixel defining layer overlaps with at least one of a conductive layer made of a material substantially the same as one or more of the gate electrodes 152, 155, the source electrodes 173, 176, and the drain electrodes 174, 177, and formed at the same layer of the gate electrodes 152, 155, the source electrodes 173, 176, and the drain electrodes 174, 177. The conductive layer includes the gate line 151, the data line 171, the common power line 172, the first sustain electrode 158, and the second sustain electrode 178. That is, at least one of and at least part of the gate line 151, the data line 171, the common power line 172, the first sustain electrode 158, and the second sustain electrode 178 is disposed under the pixel defining layer 190 and the planarization layer 180.

The planarization layer 180 and the pixel defining layer 190 have different colors. Particularly, the pixel defining layer 190 has a color having brightness becoming lower if the color of the pixel defining layer 190 is mixed with a color of the planarization layer 180. That is, if the color of the planarization layer 180 and the color of the pixel defining layer 190 are mixed together, the mixed color has brightness lower than that of each color.

In an exemplary embodiment, the pixel defining layer 190 has a complementary color to the color of the planarization layer 180 in view of subtractive mixture. That is, in an exemplary embodiment the planarization layer 180 has a color in a complementary color relationship with the color of the pixel defining layer 190.

According to the above described structure, the OLED display 100 can have improved visibility by suppressing reflection of external light.

In more detail, the brightness of the external light becomes lower by the colors of the pixel defining layer 190 and the planarization layer 180 when the reflected external light from the conductive layer disposed under the pixel defining layer passes through the pixel defining layer 190 and the planarization layer 180.

Particularly, if the pixel defining layer 190 and the planarization layer 180 have colors in a complementary color relationship, the mixed color thereof becomes close to a black color. Therefore, reflection of external light can be further suppressed because the external light cannot pass through the pixel defining layer 190 and the planarization layer 180.

If the planarization layer 180 has a substantially red color and the pixel defining layer 190 has a substantially green color as in an exemplary embodiment of the present invention, the pixel defining layer 190 passes a green light only because the pixel defining layer 190 operates as a green color filter. Since it is very difficult that green light passes through the planarization layer 180 having the substantially red color, it is possible to suppress the reflection of the external light from the conductive layer disposed under the pixel defining layer 190 and the planarization layer 180.

However, the present invention is not limited thereto. Therefore, the planarization layer 180 and the pixel defining layer 190 may have various colors that can be subtractive-mixed with each other, instead of the planarization layer 180 having the substantially green color and the pixel defining layer 190 having the substantially red color. As another example, the planarization layer 180 may have a substantially blue color and the pixel defining layer 190 may have a substantially yellow color. Further, one of the planarization layer 180 and the pixel defining layer 190 may have a substantially black color.

Referring now to FIG. 2 specifically, a structure of an OLED display 100 according to an exemplary embodiment of the present invention will be described in more detail. FIG. 2 illustrates the OLED display 100 based on the driving TFT 20, the organic light emitting element 70, and the capacitor 80.

Hereinafter, a structure of a TFT having the driving TFT 20 will be described. Also, the switching TFT 10 will be described based on differences from the driving TFT 20.

The substrate 110 is formed of a dielectric substrate made of glass, quartz, ceramic, or plastic. However, the present invention is not limited thereto. Therefore, the substrate 110 may be formed of a metallic substrate made of stainless steel.

A buffer layer 120 is formed on the substrate 110. The buffer layer 120 may be made of various materials that can prevent impurity penetration and have a planar surface. For example, one of a silicon nitride layer (SiNx), a silicon oxide layer ($SiO_2$), and a silicon oxynitride layer (SiOxNy) is used as the buffer layer 120. However, since the buffer layer 120 is not an essential element, the buffer layer 120 may be omitted according to a type of the substrate 110 and a fabrication process condition.

The driving semiconductor layer 132 is formed on the buffer layer 120. The driving semiconductor layer 132 is formed as a polysilicon layer. Also, the driving semiconductor layer 132 includes a channel area 135, a source area 136, and a drain area 137. The source area 136 and the drain area 137 are disposed at both sides of the channel area 135. The channel area is not doped with an impurity, and the source area 136 and the drain area 137 are doped with a P-type impurity (p+). Here, a doped ion material is a P-type impurity such as boron (B). Generally, $B_2H_6$ is used. Here, such an impurity may vary according to a type of a TFT.

Although a TFT having a PMOS structure using a P-type impurity is used as the driving TFT 20 in an exemplary embodiment of the present invention, the present invention is not limited thereto. Therefore, both of a TFT having a NMOS structure and a TFT having a PMOS structure can be used as the driving TFT 20.

Although the driving TFT 20 shown in FIG. 2 is a polycrystal TFT having a polysilicon layer, a switching TFT 10 not shown in FIG. 2 may be a polycrystal TFT or an amorphous TFT having an amorphous silicon layer.

A gate insulating layer 140 made of a silicon nitride (SiNx) or a silicon oxide $SiO_2$ is formed on the driving semiconductor layer 132. A gate wire having the driving gate electrode 155 is formed on the gate insulating layer 140. The gate wire further includes a gate line 151 shown in FIG. 1, the first sustain electrode 158, and other wires. The driving gate electrode 155 overlaps with at least a part of the driving semiconductor layer 132 and, particularly, overlaps with the channel area 135.

An interlayer insulating layer 160 is formed on the gate insulating layer 140, and the interlayer insulating layer 160 covers the driving gate electrode 155. The gate insulating layer 140 and the interlayer insulating layer 160 commonly include through-holes to expose the source area 136 and the drain area 137 of the driving semiconductor layer 132. The interlayer insulating layer 160 is made of a silicon nitride (SiNx) or a silicon oxide ($SiO_2$) like the gate insulating layer 140.

A data wire is formed on the interlayer insulating layer 160. The data wire includes the driving source electrode 176 and the driving drain electrode 177. The data wire further includes the data line 171 shown in FIG. 1, the common power line 172, the second sustain electrode 178, and other wires. The driving source electrode 176 and the driving drain electrode 177 are respectively connected to the source area 136 and the drain area 137 of the driving semiconductor layer 132 through through-holes.

As described above, the driving thin transistor 20 including the driving semiconductor layer 132, the driving gate electrode 155, the driving source electrode 176, and the driving drain electrode 177 is formed.

However, the structure of the driving TFT 20 according to the present invention is not limited thereto. The structure of the driving TFT 20 may be modified into various well-known structures that can be conveniently realized by those skilled in the art.

On the interlayer insulating layer 160, the planarization layer 180 is formed to cover data wires 172, 176, 177, 178. The planarization layer 180 removes and planes steps to improve luminous efficiency of the organic light emitting element 70. Also, the planarization layer 180 has a contact hole 182 to expose a part of the drain electrode 177.

The planarization layer 180 has a color. For example, the planarization layer 180 may be made of polyacrylates resin having a substantially red color. However, the present invention is not limited thereto. Therefore, the planarization layer 180 may be made of at least one of epoxy resin, phenolic resin, polyamides resin, polyimides resin, unsaturated polyesters resin, polyphenylenethers resin, polyphenylenesulfides resin, and benzocyclobutene (BCB) with dye having a predetermined color. In addition, the planarization layer 180 may be formed to have a predetermined color through well-known various methods.

The pixel electrode 710 of the organic light emitting element 70 is formed on the planarization layer 180. The pixel electrode 710 is connected to the drain electrode 177 through the contact hole 182 of the planarization layer 180.

Also, the pixel defining layer 190 is formed on the planarization layer 180. The pixel defining layer 190 has an opening that exposes the pixel electrode 710. That is, the pixel electrode 710 is disposed corresponding to the opening of the pixel defining layer 190.

The pixel defining layer 190 has a color having brightness that becomes lower overall if the color of the pixel defining layer 190 is mixed with a color of the planarization layer 180. In an exemplary embodiment the pixel defining layer 190 has a color in a complementary color relationship with the color of the planarization layer 180 in view of subtractive mixture. For example, the planarization layer 180 is formed to have a substantially red color and the pixel defining layer 190 is formed to have a substantially green color. The pixel defining layer 19 may be made of resin such as acryl-based polyacrylates or polyimides and silica type mineral with dye having a predetermined color. In addition, the pixel defining layer 190 may be formed to have a predetermined color through well-known methods.

The organic emission layer 720 is formed on the pixel electrode 710 in the opening of the pixel defining layer 190, and the common electrode 730 is formed on the pixel defining layer 190 and the organic emission layer 720.

As described above, the organic light emitting element 70 having the pixel electrode 710, the organic emission layer 720, and the common electrode 730 is formed.

One of the pixel electrode 710 and the common electrode 730 may be made of a transparent conductive material, and the other may be made of a translucent or reflective conductive material. The type of material used to form the pixel electrode 710 and the common electrode 730 determines the type of the OLED display 100, such as, a top emission type, a bottom emission type, or a dual emission type. The OLED display 100 according to an exemplary embodiment of the present invention is formed as a top emission type.

Indium tin oxide (ITO), indium zinc oxide (IZO), zinc oxide (ZnO), and indium oxide ($In_2O_3$) may be used for the transparent conductive material. Lithium (Li), calcium (Ca), lithium/calcium fluoride (LiF/Ca), lithium/aluminum fluoride (LiF/Al), aluminum (Al), silver (Ag), magnesium (Mg), or gold (Au) may be used for the reflective material.

The organic emission layer 720 is made of a low molecule organic material or a high molecule organic material. The organic emission layer 720 is formed as a multilayer including a hole injection layer (HIL), a hole transport layer (HTL), an emission layer, an electron transport layer (ETL), and an electron injection layer (EIL). That is, the hole injection layer (HIL) is disposed at the pixel electrode 710, which is an anode, and the hole transport layer (HTL), the emission layer, the electron transport layer (ETL), and the electron injection layer (EIL) are sequentially stacked thereon.

A sealant seals the TFTs 10, 20 and the organic light emitting element 70 formed on the substrate 110, protecting them from the outside.

According to the described configuration, the OLED display 100 has improved visibility by suppressing reflection of an external light.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display, comprising:
   a substrate;
   a thin film transistor on the substrate and including a gate electrode, a source electrode, and a drain electrode;
   a planarization layer formed on the thin film transistor and having a contact hole exposing a part of the drain electrode;
   a pixel electrode on the planarization layer and connected to the drain electrode of the thin film transistor through the contact hole; and
   a pixel defining layer on the planarization layer and having an opening exposing the pixel electrode,
   wherein the planarization layer has a single color throughout the display, and the pixel defining layer and the planarization layer have different colors and wherein a brightness of a mixed color of the pixel defining layer and the planarization layer is lower than a brightness of each color of the pixel defining layer and the planarization layer.

2. The organic light emitting diode display of claim 1, wherein one of the planarization layer and the pixel defining layer has a substantially black color.

3. The organic light emitting diode display of claim 1, further comprising a conductive layer made of a material substantially the same as at least one of the gate electrode, the source electrode, and the drain electrode at a layer substantially the same as at least one of the gate electrode, the source electrode, and the drain electrode, and
   at least part of the conductive layer is under the pixel defining layer.

4. An organic light emitting diode display, comprising:
   a substrate;
   a thin film transistor on the substrate and including a gate electrode, a source electrode, and a drain electrode;
   a planarization layer formed on the thin film transistor and having a contact hole exposing a part of the drain electrode;
   a pixel electrode on the planarization layer and connected to the drain electrode of the thin film transistor through the contact hole; and
   a pixel defining layer on the planarization layer and having an opening exposing the pixel electrode,
   wherein the pixel defining layer and the planarization layer have different colors, a brightness of a mixed color of the pixel defining layer and the planarization layer is lower than a brightness of each color of the pixel defining layer and the planarization layer, and a color of the pixel defining layer and a color of the planarization layer are in a complementary color relationship.

5. The organic light emitting diode display of claim 4, wherein one of the planarization layer and the pixel defining layer has a substantially red color, and the other of the planarization layer and the pixel defining layer has a substantially green color.

6. The organic light emitting diode display of claim 5, wherein the one of the planarization layer and the pixel defining layer having the substantially red color includes an acryl type resin.

* * * * *